United States Patent [19]

Musiani

[11] Patent Number: 4,744,141

[45] Date of Patent: May 17, 1988

[54] APPARATUS FOR AUTOMATICALLY INSERTING LEADS ON ELECTRICAL AND/OR ELECTRONIC COMPONENTS INTO CORRESPONDING HOLES IN A SUBSTRATE

[75] Inventor: Mario Musiani, Bologna, Italy

[73] Assignee: Arcotronics Italia S.p.A., Bologna, Italy

[21] Appl. No.: 923,837

[22] PCT Filed: Nov. 20, 1985

[86] PCT No.: PCT/GB85/00529

§ 371 Date: Oct. 20, 1986

§ 102(e) Date: Oct. 20, 1986

[87] PCT Pub. No.: WO86/03369

PCT Pub. Date: Jun. 5, 1986

[30] Foreign Application Priority Data

Nov. 20, 1984 [IT] Italy .................................. 3628 A/84

[51] Int. Cl.⁴ ............................................. H05K 3/30
[52] U.S. Cl. .................................... 29/741; 29/564.1; 29/838
[58] Field of Search .................. 29/741, 759, 834–839, 29/564.1, 564.7, 564.8

[56] References Cited

U.S. PATENT DOCUMENTS 4,628,595  12/1986  Fujita et al. ........................... 29/741

Primary Examiner—Carl E. Hall
Attorney, Agent, or Firm—Spencer T. Smith

[57] ABSTRACT

The apparatus comprises two carriages 4, 5, movable in opposite directions F1, F2, and operable in an operating station S below a substrate 100. The carriages comprise corresponding bushes 23, 24, movable perpendicularly relative to the substrate 100, and within which slide needles 47, 48. Bushes 23, 24 are positioned in contact with the printed circuit, and co-axially with respect to two holes 100a chosen in the latter to allow the needles to pass through the aforesaid holes. Above substrate 100, device 150 centers the needles relative to the projecting leads 10, on component 11, which are held between clamping mechanism 2 stationary in station S. After they have been centered, the needles are raised to meet the ends of the leads 10a triggering off a device 200 which moves component 11 down towards substrate 100 at the same time as the needles move back down again, until leads 10 are inserted into holes 100a and bushes 23, 24 which then bend those sections of leads 10 which are protruding from circuit 100 (10c) back against the underside of the circuit.

4 Claims, 5 Drawing Sheets

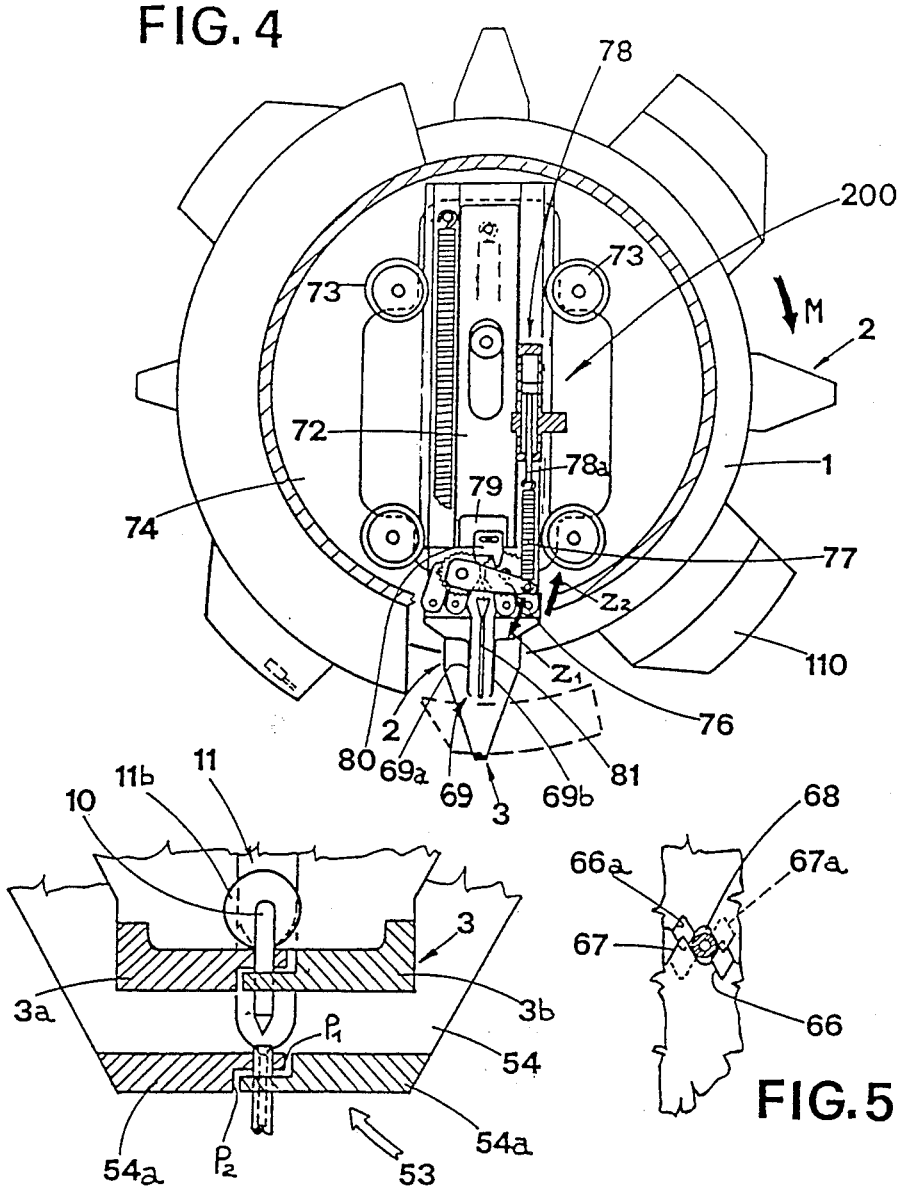
FIG. 4
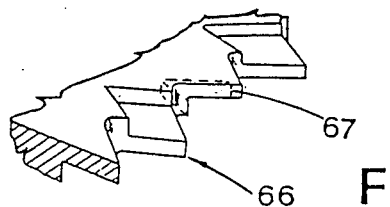
FIG. 5a
FIG. 5b
FIG. 5c

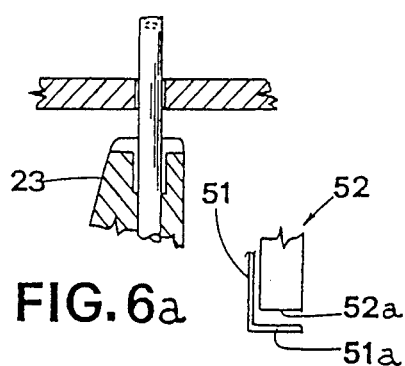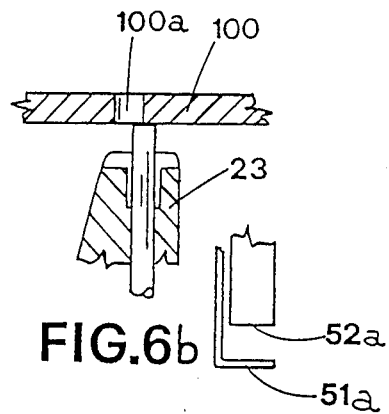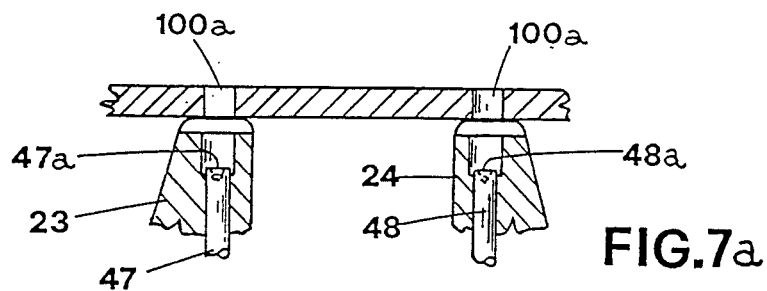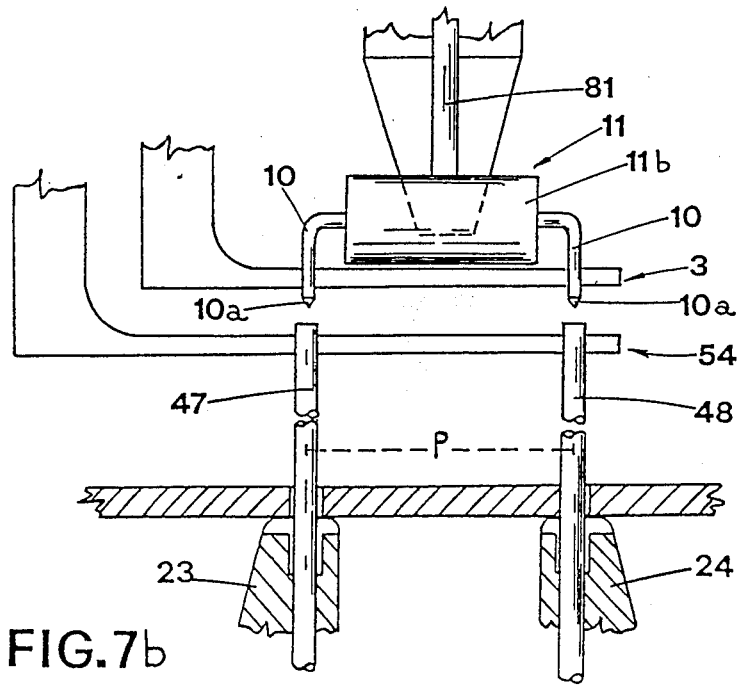

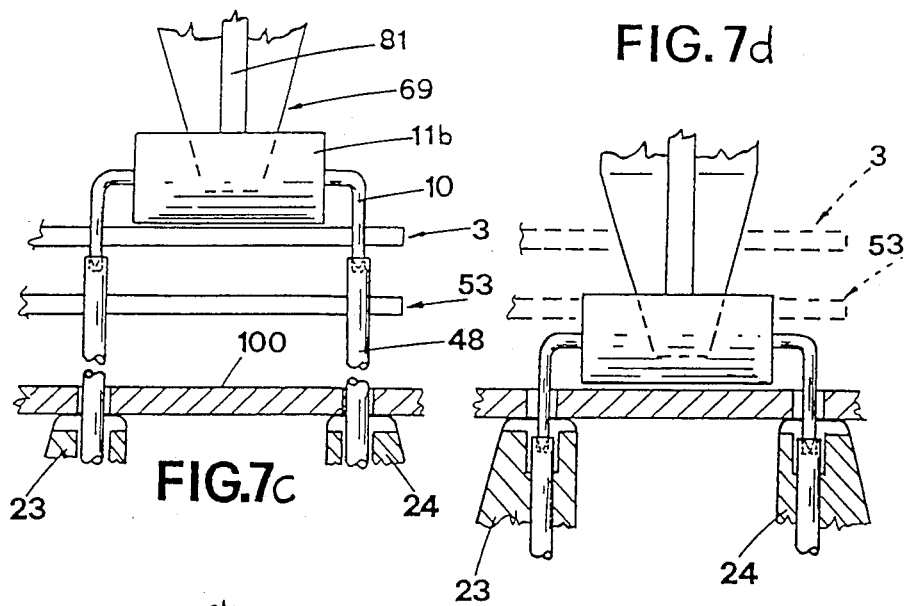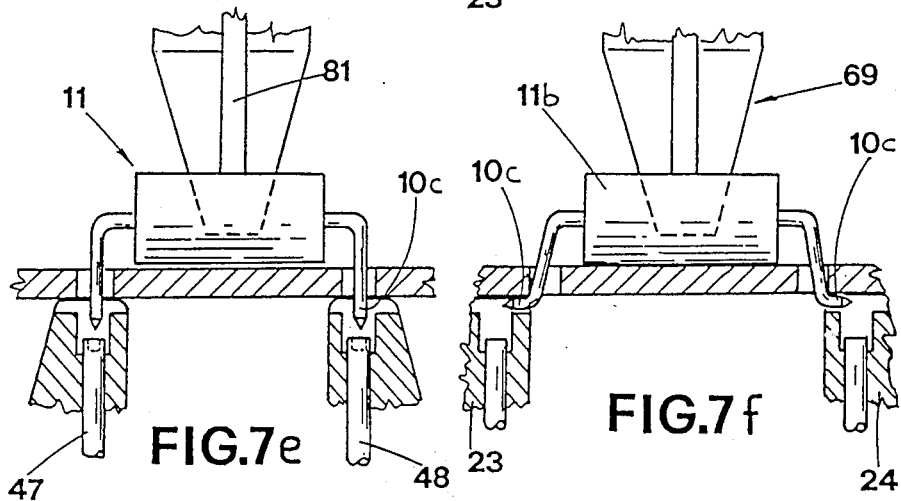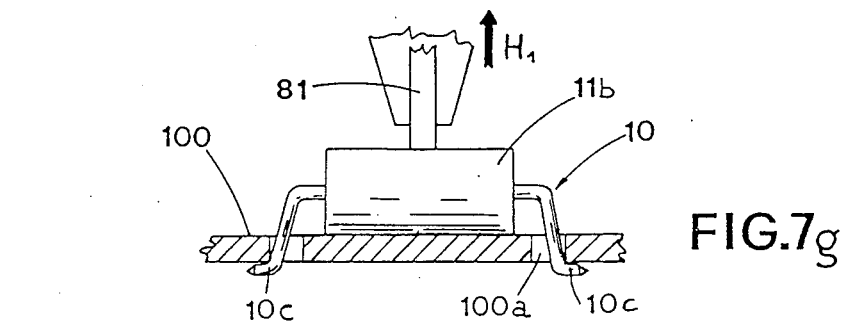

APPARATUS FOR AUTOMATICALLY INSERTING LEADS ON ELECTRICAL AND/OR ELECTRONIC COMPONENTS INTO CORRESPONDING HOLES IN A SUBSTRATE

TECHNICAL FIELD

This invention is concerned with the automatic assembly of electrical and/or electronic components on a corresponding substrate e.g. a printed circuit, especially the final stage of assembly, namely inserting the leads on the components into corresponding through holes in the substrate.

To this end it is necessary beforehand to bend the above-mentioned leads in the same direction with respect to the body of the component, with these leads parallel and a pre-arranged distance (pitch) apart; this function is carried out by appropriate bending devices associated with the present apparatus. Finally it is necessary, by means of corresponding devices, to cut off the leads so that they are of such a length, with respect to the body of the component (in the case of leads which are perpendicular to the axis of the body of the component) or with respect to one head of the above-mentioned body (in the case of leads which are parallel to the axis of the body), as to enable these leads, when inserted into the holes in the substrate, to protrude by a pre-arranged amount beyond the latter. When the above-mentioned operation to cut off the leads has been completed, appropriate clamping devices move the components intermittently into an operating station in which the substrate is positioned.

BACKGROUND ART

Existing types of apparatus for inserting the leads of components into the holes in a printed circuit are complicated, cumbersome and not very functional. One type of apparatus has pincers which grip the body of the component and, with the help of guides, previously positioned around the chosen holes, perform the above-mentioned inserting operation.

Another type of apparatus has two pincers which grip two leads on the component, the aforesaid pincers centre the leads with respect to the chosen holes and then insert the leads gripped between them into these holes.

It is obvious how complex and bulky such a piece of apparatus is, and its bulkiness represents a considerable drawback when one considers the fact that it is necessary to work in a restricted space not much bigger than the space allocated for the corresponding component. Also this type of apparatus cannot provide information as to whether or not the above-mentioned inserting operation has been carried out satisfactorily; and, if not, it will be the job of the operators to then take steps to remove scraps of waste material from the printed circuit.

An object of this invention is to provide a piece of apparatus which enables the leads on electrical and/or electronic components to be inserted into the corresponding through holes in a printed circuit, and which, after the aforesaid inserting operation has been carried out, enables the aforesaid leads to be clamped to the circuit itself. In preferred apparatus it is established that the holes in the substrates are in fact there, and checked that all the leads have been inserted into the relevant holes.

Another object of the invention is to provide apparatus, which is capable of inserting leads in the holes of a printed circuit regardless of the pitch between the above-mentioned leads.

DISCLOSURE OF THE INVENTION

In one aspect the invention may provide apparatus for automatically inserting leads on electrical and/or electronic components through holes in a substrate comprising an operating station S at which a substrate can be positioned and at which, one side of the substrate can be disposed clamping mechanism, carried by an intermittently moving conveyor, for clamping the leads on one of the components with the aforesaid leads protruding parallel to each other by predetermined amounts from the clamping mechanism by which they are held perpendicular relative to the above-mentioned substrate characterised in that the apparatus further comprises: two carriages located at the station S at the opposite side of the aforesaid substrate to the above-mentioned clamping mechanism, mounted for movement in opposite directions parallel to the substrate, two bushes mounted on the carriages, for sliding movement with respect to the relevant carriages towards and away from the substrate; first means so moving the bushes; Two needles mounted on the carriages, slide freely through and guided by a corresponding one of the two above-mentioned bushes for movement in a direction perpendicular to the substrate; second means for so moving the needles a first device positioned at the station S on the same side of the substrate as the clamping mechanism and acting in phase with said second means for centering the needles when protruding beyond the printed circuit, with respect to the leads held by the clamping mechanism at the station with the needles themselves being slideable perpendicular to the substrate; a second device, positioned on the same side of the substrate as the first, acting in phase with the first device, with said second means and with said first means for translating the above-mentioned carriages, this second device being arranged in the operation of the apparatus to engage at least the body of the component which has its leads held by the clamping mechanism with ends in contact with corresponding ends of the needles and then after the first device has disengaged from the needles and the clamping mechanism disengaged from the leads to move the component towards the substrate, the needles at the same time being withdrawn from the relevant holes in the printed circuit, whereby the leads are inserted in the holes and shortly afterwards in the bushes and, after the leads have been inserted into the bushes and the body of the component moved to a predetermined position relative to the substrate, the carriages being arranged to be moved in opposite directions, so that the parts of the leads which are projecting beyond the substrate are bent, by the above mentioned bushes, against the underside of the substrate.

Preferred apparatus embodying the invention enables the above-mentioned inserting operation to be carried out without interferring with components already clamped to the printed circuit.

Preferred apparatus embodying this invention can draw attention to abnormal situations such as will prevent the above-mentioned inserting operation taking place, and also to abnormal situations resulting from incomplete or unsatisfactory inserting operations and which, consequently, is capable of moving the corresponding component towards a station where it can be removed.

Preferred apparatus embodying this invention is extremely functional and capable of showing a high operating speed with a beneficial effect on the productivity of the apparatus itself and on that of the associated lead bending and lead cutting devices.

In preferred apparatus it is established that the holes in the substrates are in fact there, and checked that all the leads have been inserted into the relevant holes.

There now follows a detailed description, to be read with reference to the accompanying drawings, of apparatus embodying the invention. It will be realised that this apparatus has been selected for description to illustrate the invention by way of example and that the invention may reside in any novel feature or combination of features described.

BRIEF DESCRIPTION OF DRAWINGS

FIG. 4 illustrates a diagrammatic view of section III—III of FIG. 1;

FIG. 5a illustrates in diagrammatic form and on an enlarged scale, heads of centering prongs;

FIG. 5b illustrates a side view of teeth of the heads;

FIG. 5c illustrates a view of a portion of the teeth in perspective;

FIGS. 6a, 6b illustrate respectively, in diagrammatic form, the situation where a search by needles to find chosen holes in a printed circuit has been successful, and one where it has been unsuccessful, and the corresponding position of catch projections, associated with the needles, with respect to the relevant sensors;

FIGS. 7a, 7b, 7c, 7d, 7e, 7f, 7g illustrate in diagrammatic form progressive stages in the insertion of leads into the corresponding holes chosen in the printed circuit.

BEST MODE FOR CARRYING OUT THE INVENTION

Figure 1:
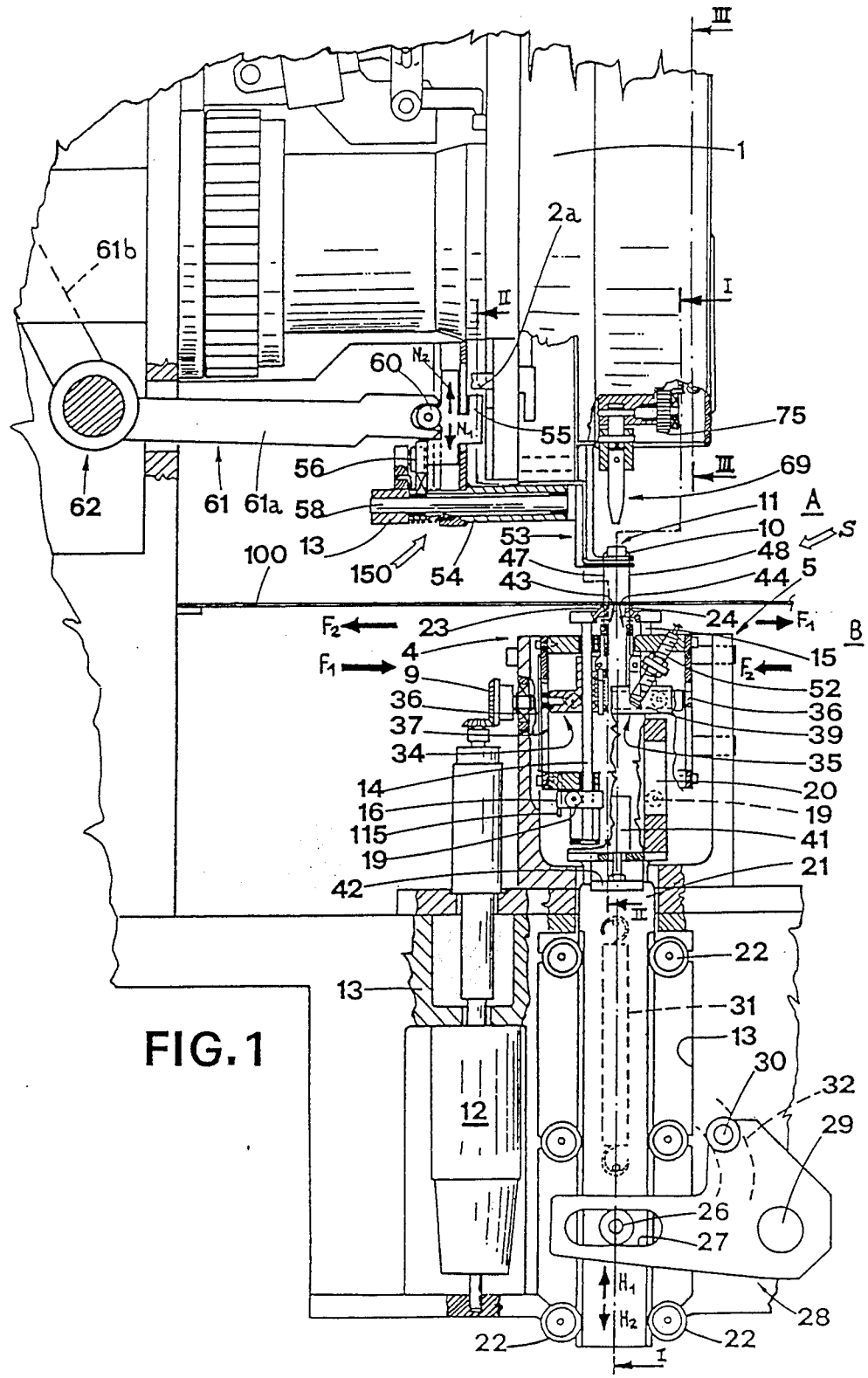
FIG. 1 illustrates a side diagrammatic view, partially sectioned in accordance with different planes, of the present apparatus in its operating phase.

FIG. 1 indicates a conveyor, of the carousel type, moveable intermittently in direction M and fitted with clamping mechanism 2, comprising a clamping pincer 3 which grips the leads 10 of electrical and/or electronic components 11 between prongs 3a, 3b.

The function of each pincer 3 is to grip a component 11, by the relevant leads, in a feeding station, (not illustrated), to transfer this same component to a cutting station (not illustrated), in which the leads are cut so as to determine for them a pre-arranged length depending on the thickness of a corresponding substrate viz. a printed circuit 100, and finally to transfer the above-mentioned component to an operating station S in which this same pincer 3 is kept stationary for pre-arranged length of time.

The above-mentioned printed circuit 100, carried by appropriate feed mechanisms (not illustrated) is positioned in station S and 'divides' this station into two areas A (where pincer 3 is held stationary) and B positioned on opposite sides of circuit 100.

In area B there are two carriages 4, 5 supported for sliding movement by rods 6 parallel with printed circuit 100.

Two carriages 4, 5 are clamped two threaded sleeves 7, which have respectively right handed and lefted threads, with which are engaged corresponding threaded portions of a drive shaft 8 which is rotatable via a bevel gear 9, by the shaft of an electric motor 12 supported by a fixed supporting structure 13; rotating the shaft in one or the other direction causes carriages 4, 5 respectively to move closer to each other (directions F1, F2) or move away from each other (directions F2, F1).

Carriages 4, 5 support corresponding rods 14, 15 which are parallel with each other and perpendicular to circuit 100; both the above-mentioned rods can slide axially.

At the top of rods 14, 15 are corresponding bushes 23, 24, the axes of which are parallel with the relevant rods; the distance between the axes of the two bushes is less than the distance between the two above-mentioned rods.

Figures 2, 3:
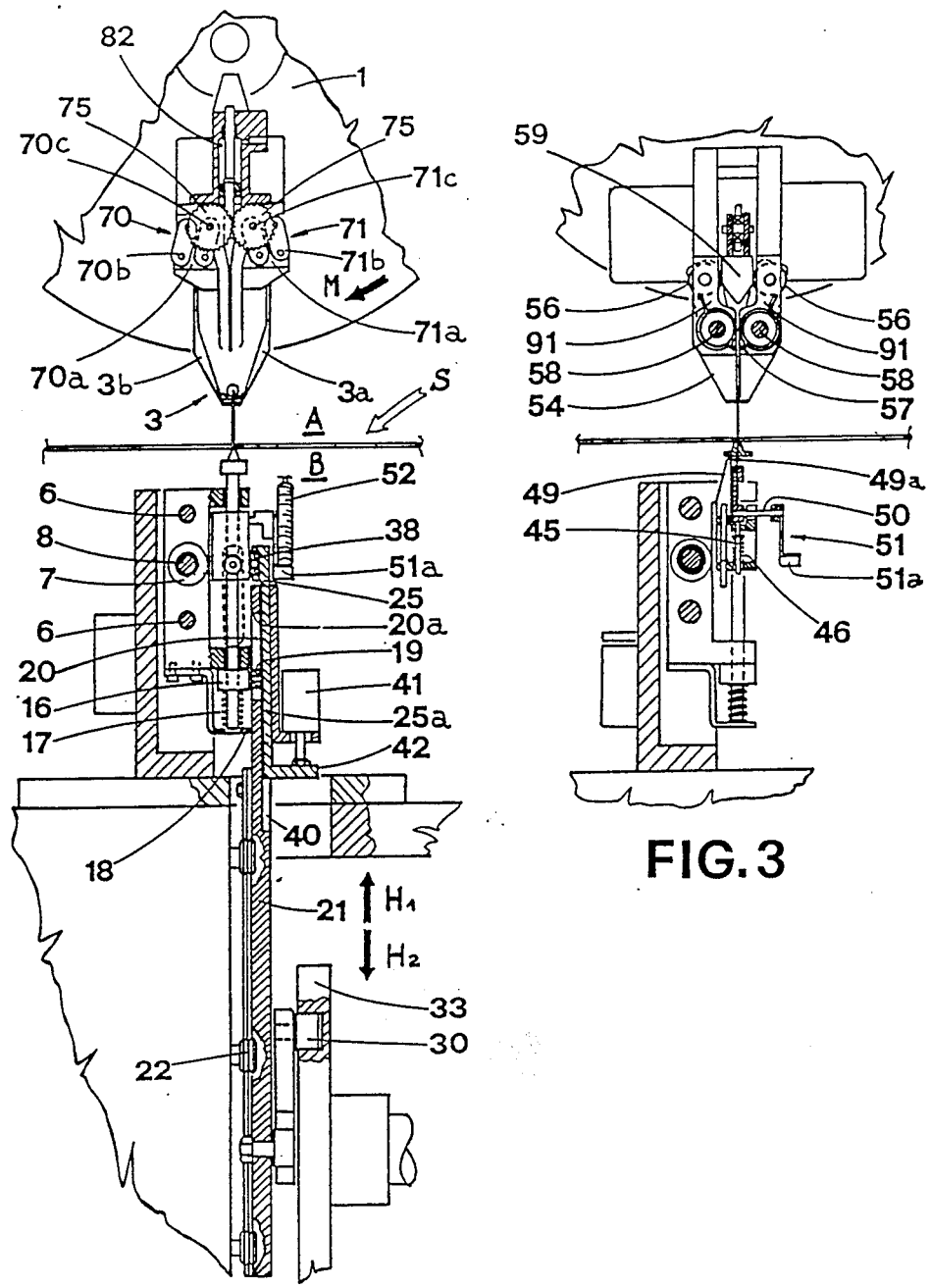
FIG. 2 illustrates a diagrammatic view of section I—I of FIG. 1.
FIG. 3 illustrates a diagrammatic view of section II—II of FIG. 1.

Clamped to rods 14, 15 around the lower portions thereof, are corresponding sleeves 16 each of which supports a small roller 19 for rotation. The sleeves 16 are subject to the action of corresponding springs 17 placed between the sleeves themselves and stops 18 integral with the relevant carriages 4, 5 (FIGS. 1 and 2).

In the absence of external forces acting on small rollers 19, springs 17 keep the corresponding bushes 23, 24 pressed against the lower side of printed circuit 100.

Small rollers 19 are housed in two housings 20 incorporated in a slide 21 which is guided, in directions H1, H2 perpendicular to circuit 100, by a number of small wheels 22 which are supported for rotation by the structure 13; in order to prevent each sleeve 16 rotating with respect to the axis of the associated stem 14, 15 a pin 115 is clamped on one side to the sleeve itself and, on the other side, guided axially by the relevant carriage. Slide 21 supports the pin of a small roller 26 which slides in a slot 27 cut out of a lever arm 28 which pivots around a fulcrum 29 in structure 13; the remaining part of the lever arm 28 carries a small roller 30 which, by means of a spring 31, placed between slide 21 and fixed structure 13 (FIG. 1.), is kept gripping a cam track in a disc 33.

The rotation of disc 33 in direction V causes the translation of slide 21 in directions H1, H2.

The translation of slide 21 in direction H2 causes contact surfaces 20a on the upper parts of housing 20, to come up against small rollers 19; this causes the equiverse translation of the two sleeves 16 (and rods 14, 15 which are connected to them) against the elastic reaction of springs 17.

The translation of slide 21 in direction H1 causes the equiverse translation of sleeves 16 (due to the action exerted on them by the previously compressed springs 17), until the corresponding bushes 23, 24 come hard up against the printed circuit 100: at this point there is a gap between contact surfaces 20a and small rollers 19.

On rods 14, 15 are fitted, idle, corresponding runners 34, 35; these runners support the pins of small rollers 36, one for each runner, sliding within corresponding slots 37 in carriages 34, 35.

The insertion of small rollers 36 in slots 37 prevent the runners 34, 35 rotating with respect to the relevant stems and at the same time enables the runners themselves to slide axially.

Runners 34, 35 support the pins of small dragging rollers 38, one for each runner, the axes of which are perpendicular to the axes of the corresponding rods 14, 15 and the axes of small guide rollers 36 and parallel with the axes of small rollers 19 held fast to the above-mentioned sleeves 16.

Small dragging rollers 38 slide within two guides 39, one for each carriage 4, 5, which are co-axial with each other and parallel with the directions of translation F1, F2 of the aforesaid carriages 4, 5.

Guides 39 are made from two shaped metal sections 25 which have corresponding arms 25a which face in the direction of slide 21; these arms 25a are inserted in the same number of housings 40 in the slide itself, with the possibility of sliding relatively with respect to the latter (directions H1, H2) through the action of an associated pneumatic jack 41 supported on a cantilever basis by a wall 42 integral with the slide; the travel imposed by jack 41 on shaped metal sections 25 is less than the maximum travel allowed for slide 21: the reasons for this will be explained subsequently.

Obviously translations of slide 21 (which take place for reasons which will be explained subsequently, with jack 41 out of action) involve equiverse translations of shaped metal sections 25 and, therefore, also of runners 34, 35 since they are dragged by the latter.

Held fast to runners 34, 35 are corresponding moving elements 43, 44; each element is held fast by means of a small pin 45 sliding in two through co-axial holes, made in the corresponding runner, and subject to the action of a spring 46 (see FIG. 3). These holes are perpendicular to circuit 100 and so elements 43, 44 can translate, with respect to the relevant runners, in directions H1, H2: translation in direction H2 is opposed by spring 46.

Anchored to the above-mentioned elements 43, 44 are corresponding needles 47, 48 which are inserted in the corresponding bushes 23, 24 of rods 14, 15; in order to limit bending of the above-mentioned needles in the sections between the moving elements and the relevant bushes, there are appendages 49, clamped to the above-mentioned runners 34, 35 the heads of which 49a are positioned in the aforesaid sections: in these heads 49a are through holes, co-axial with the corresponding bushes 23, 24, through which the corresponding needles 47, 48 pass.

The heads of these needles 47, 48 turned towards circuit 100, have blind holes, or niches 47a, 48a in, the function of which will be explained subsequently.

Clamped to moving elements 43, 44 are two pins 50, perpendicular to the above-mentioned directions H1, H2, which support on a cantilever basis corresponding arms 51 the lower ends of which 51a are associated with two sensors 52 clamped to the corresponding runners 34, 35.

In the absence of external causes acting on moving elements 43, 44, end 51a is situated at the minimum distance from the operating head 52a of the relevant sensor 52; if either moving element slides in direction H2, the corresponding ends 51a move away from the operating head of the relevant sensor 52; in this way, from the electrical signals supplied by the sensors, it is possible 'to extract' information, the importance of which will be pointed out subsequently.

In area A of station S there is a device 150 for centering the above-mentioned needles 47, 48.

This device consists of a pincer 53, of which the prongs 54 are positioned so as not to interfere either with 'carousel' 1 or the prongs 3a, 3b of pincer 3. These prongs 54 are hinged at 58 to the fixed structure 13 and have arms 91 attached, the upper ends of which are fitted with small rollers 56 (FIG. 3). The above-mentioned arms 91 are subject to the action of torsional springs 57 which, in the absence of external causes, keep the operating ends 54a of the relevant prongs in the 'open' position.

The 'closed' position for the above-mentioned operating ends 54a is brought about by inserting a wedge 59 between rollers 56, thus overcoming the springs 57.

Wedge 59 is carried by a small mobile frame 55 hinged at 60 to one end 61a of a lever arm 61 pivoting around a fulcrum 62 in fixed structure 13; the remaining lever arm 61b is made to oscillate by means of cam-driven mechanisms (not shown).

The movement of small frame 55 in direction N1 causes prongs 54 to close, whilst its movement in the opposite direction N2, causes the prongs to open; during the movement of small frame 55 in direction N2 it comes up against an appendage 2a associated with the control mechanisms, (not shown), from the clamping mechanism 2: in particular this causes the opening of prongs 3a, 3b of pincer 3.

Each operating end 54a of prongs 54 contains, in two staggered planes, teeth 66, 67 as illustrated in FIGS. 5a, 5b: teeth 66a, 67 on the remaining operating end 54a are complementary with respect to teeth 66, 67: obviously the bottom of each space in the teeth will never be filled by the corresponding tooth.

The function of these teeth is to define, in the 'closed' position of the prongs 54, a pair of housings 68 to receive the of needles 47, 48, with each pair of housings presenting the same distance between centres as the chosen pitch between the needles.

The housings 68 of a pair are co-axial with the corresponding leads 10 of a corresponding component 11 (presenting the same pitch as the distance between the centres of the aforesaid housings) positioned in station S by means of pincer 3; the above-mentioned housings 68 are for 'centering' needles 47, 48 with respect to the aforesaid leads and at the same time they must enable these needles to slide through them.

The fact of providing two sets of teeth in two different staggered planes P1, P2 for each prong 54a, makes it possible to have teeth, and relevant spaces, of greater depth than can be obtained with a single set of teeth (obviously for the same pitch p); this is extremely advantageous in that it increases the 'useful centering space' in which the aforesaid prongs 54a operate.

In the above-mentioned area A of the station S there is a device 200 for taking components 11, lying in S, and moving them towards printed circuit 100.

Device 200 consists of a pincer 69 the jaws of which 69a, 69b, in the inoperative configuration of the device, are positioned above the body 11a of the component 11 (see FIGS. 1, 2).

Jaws 69a, 69b are carried by the mobile sides 70a, 71a of two articulated parallelograms 70, 71; the small connecting rods 70b, 71b of these parallelograms are hinged, respectively by means of pins 70c, 71c, to a runner 72 slideable in directions H1, H2, guided by small wheels 73 supported for rotation by a small fixed frame 74.

Keyed onto two pins 70c, 71c, one per parallelogram, are two toothed wheels 75 in mesh; also keyed onto pin 70c is a small lever 76 to which is hooked the end of a spring 77 the remaining end of which is under tension even with the jack 78 out of action.

Sliding on runner 72 is a slide 79 having at its lower end a catch projection 80; runner 72 and slide 79 are operated by corresponding mechanical mechanisms, (not shown), acting in phase with each other as well as with the operation of the 'needle centering' device 150 and with the bringing into action, and putting out of action, of jack 78; also the operation of runner 72 is in phase with the operation of slide 21.

The relative sliding of slide 79 with respect to runner 72 (in direction H2), causes catch projection 80 to come up against small lever 76 which rotates in direction Z1: this causes jaws 69a, 69b to open; the relative sliding of the slide, with respect to runner 72, in the opposite direction H1, allows the above-mentioned jaws to close through the action of spring 77 on a small lever 78 which rotates in the opposite direction 22.

Device 200 also contains a pressure device 81 perpendicular to printed circuit 100 and positioned between jaws 69a, 69b; pressure device 81 is integral with the stem of a pneumatic jack 82 of the single-action type.

At rest slide 21 is in the lowest position it can be in; in this position contact surfaces 20a of housings 20 are up against small rollers 19 of sleeves 16 which, by the action of the associated springs, are maintained in their lowermost position.

Once again at rest, runner 72 is in its uppermost position; jacks 78 and 82 are out of action, as is jack 41.

At rest the distance between the upper heads of bushes 23, 24 and the underside of circuit 100 is less than the maximum travel of which the rods 14, 15 are capable; with the bushes in this position, the travel imposed on needle 47, 48 by the relevant runners 34, 35 as a result of bringing jack 41 into action, is sufficient to enable the needles to pass through and beyond the circuit (obviously in those places where there are holes, co-axial with the needles, provided in the circuit).

To has been used to show the beginning of an elementary cycle within the present piece of apparatus 'carousel' 1 is rotating to bring a component 11, the leads 10 of which are clamped between prongs 3a, 3b of pincer 3, into station S.

It has been assumed that at instant To printed circuit 100 has already been moved and/or rotated (by means of corresponding mechanism, not shown), controlled by of a microprocessor unit, not shown so as to position the two chosen through holes 100a (that is to say the holes capable of taking the leads 10 of the component 11 positioned in S) co-axially with respect to the pre-arranged position which leads 10 will take up in S.

The microprocessor sends an instruction to motor 12 to set carriages 4, 5 in motion until the distance between the axes of bushes 23, 24 is the same as the pitch p between the selected holes 100a; it has been assumed that at instant T1 the aforesaid situation has been satisfactorily accomplished. At instant T2 (next one, at the limit coinciding with T1) jack 41 is brought into action; this causes the movement of runners 34, 35 in direction H1 for a distance less than the maximum travel of slide 21; if the operation is successful and needles 47, 48 are in fact inserted in holes 100a (see FIG. 6a), there is no relative sliding between moving elements 43, 44 and the relevant runner; the distance between end 51a and the operating head of sensor 52 remains unchanged; electrical signals are sent by these sensors to this effect (see FIG. 6a once more).

If on the other hand the operation is not successful and at least one of needles 47, 48 is obstructed by circuit 100 (as illustrated in FIG. 6b) the moving element 43, 44, associated with the particular needle, does in fact slide with respect to the relevant runner; this fact is signalled by the corresponding sensor 52, since end 51a of arm 51 moves away from operating head 52a of the sensor (see FIG. 6b once more).

If the operation is unsuccessful, the microprocessor prevents all the subsequent stages; if on the other hand the operation is successful, the apparatus operates as described below.

Jack 41 is activated and de-activated; the so-called 'touching' stage (that is to say checking for the presence of the chosen holes) comes to an end at instant T3: at this point shaped metal profiles 25, and with them runners 34, 35, are returned to the rest position.

When the operation has been successful, that is to say when both holes 100a are positioned co-axially with respect to bushes 23, 24 at instant T4, immediately following (or coinciding) with T3, it has been assumed that pincer 3 is in S; at instant T4 slide 21 begins its movement in direction H1, runner 72 begins its travel in direction H2 with slide 79 in the very lowest position with respect to the relevant runner 72, therefore with jaws 69a, 69b open.

The descent of runner 72 causes pressure device 81 to come up against body 11b; since jack 82 is out of action, the piston of this jack slides within the relevant cylinder without encountering any appreciable friction; in other words the fact of the two mentioned parts coming into contact causes virtually no resistance to the descent of runner 72.

At instant T5 bushes 23, 24 come up against circuit 100 (FIG. 7); this causes small rollers 19 to be detached from surfaces 20a: bushes 23, 24 are held under pressure against circuit 100 by the elastic reaction of the associated springs 17.

Movement of needles 47, 48, coincides with the movement of slide 21, until they come up against a fixed catch projection; at instant T6 needles 47, 48 have already passed through and beyond circuit 100 and are in the area in which the operating heads of prongs 54 of centering pincer 53 operate: between T6 and T7 there is a period during which slide 21 is stationary, during which time teeth 66, 67, 66a, 67a move towards each other in order to define centering housings 68, for centering needles 47, 48 with respect to the overhanging leads 10, (see FIG. 7b).

Meanwhile, in the interval T4–T7, runner 72 will have stopped (for example at instant T5) to allow jaws 69a, 69b to close around the body 11b of component 11 (this is brought about by the return of slide 79, relative to runner 72, to its very highest position; at a point immediately after jaws 69a, 69b close (for example at instant T6) jack 78 is brought into action which, in conjunction with the associated spring 77, enables the aforesaid jaws to grip the above-mentioned body 11b with a pre-arranged pressure: under the conditions just recalled, jack 82 is still out of action.

At instant T7 slide 21 starts to move up again; in this way the upper ends of the needles make contact with the lower end 10a of leads 10, or to be more precise the above-mentioned ends 10a enter into niches 47a, 48a of needles 47, 48 (see FIG. 7c); the movement of the slide, subsequent to the aforesaid entry (instant T8), involves relative sliding movements of elements 43, 44 with respect to the relevant runners 34, 35: this is 'signalled' by sensors 52, and at the same time slide 21 comes to a halt (instant T9).

In the interval T9–T10 slide 21 and runner 72 are assumed to be stationary; in the aforesaid interval prongs 3a, 3b of pincer 3 open as do the prongs 54 of centering pincer 53.

At instant T10 slide 21 begins its descent in direction H2 whilst at the same time runner 72 describes an equiverse translation.

At instant T11 the ends 10a of leads 10 are already inserted in the relevant holes 100a and in the corresponding bushes 23, 24 (see FIG. 7d); at the aforesaid instant runner 72 has reached its lowest position, whilst slide 21 is stationary.

At this point the microprocessor, by analysing the signals supplied by sensors 52, is in a position to check whether or not leads 10 have been inserted in holes 100a; if the operation has been successful, and the leads have in fact been inserted in the holes, end 51a of arm 51 will be at its furthest position from operating end 52a of the relevant sensor (since the contact between needle and lead is subject to the springs 46 of the relevant moving element being put under compression).

If the operation is unsuccessful, and the leads have not been inserted in the holes, the corresponding moving element 43, 44 would, due to the action of the associated spring 46, be in the very highest position with respect to the relevant runner 34, 35: this is signalled by the corresponding sensor 52.

The subsequent stages presuppose that the operation has been successful, in other words that both leads 10 are inserted in holes 100a.

In the interval T11–T12 slide 21 moves down (by a small amount) in direction H2 (and with it elements 43, 44 and relevant needles 47, 48), whilst runner 72 remains stationary.

At instant T12 ends 47a, 48a of the needles are separated from ends 10a of leads 10 (see FIG. 7e).

In interval T12–T13 with slide 21, for example, carriages 4, 5 are made to move in opposite directions: this causes sections 10c of the leads protruding from printed circuit 100 to be sent against the underside of the printed circuit (see FIG. 7f).

At instant T13 jack 82 of pressure device 81 is brought into action and jack 78 connected to spring 77 acting, via lever 76, on jaws 79a, 79b is put out of action; at instant T14 the aforesaid operations are assumed to have been completed.

At instant T14 slide 21 is still moving in direction H2 to complete its descent (which is assumed to be completed at instant T15), whilst runner 72 is beginning its ascent (in direction H1): as runner 72 re-ascends, jaws 69a, 69b—under the action of spring 77—hug the body 11b of the component 11: this is extremely advantageous in that it avoids the jaws invading the spaces surrounding the above-mentioned body, where other components 11 may already have been positioned.

During the re-ascent of the jaws, the action exerted by pressure device 81 in the opposite direction on the body 11b (see FIG. 7g) prevents even the slightest lifting of the body itself or circuit 100 to which it is clamped.

The flexibility of the material from which jaws 69a, 69b are made enables them to 'give' as they hug body 11b without giving rise to sufficient stresses to cause the component and/or the jaws themselves to be broken and/or torn and/or scraped. It should also be pointed out that the elasticity of the aforesaid jaws is particularly advantageous as regards their 'grip' on body 11b.

For example the jaws may have the ability to 'adapt' first to a parallelepipedal-shaped body 11b and then to cylindrical one; a cylindrical-shaped body 11b may have dimensions such as to involve the lower ends of the jaws coming into contact with each other; finally the jaws may grip both the body 11b and leads 10 thereof.

At instant T16 it has been assumed that the ascent of runner 72 has been completed; obviously as soon as jaws 69a, 69b are for sure external to body 11b, pressure device 81 is also dragged upwards by runner 72.

At instant T16 the operating cycle of the apparatus has been completed. If one of the leads 10 had failed to be inserted in relative hole 100a (instant T11), the microprocessor would not have allowed the stages just described and subsequent to the aforesaid T11 to take place.

In a case such as this, runner 72 is made to go back up with the body 11b clamped between jaws 69a and 69b.

The apparatus has pockets 110 set between the clamping mechanism 2 which move in step with this mechanism for collecting 'rejected' components; when a pocket 110 passes into S (see FIG. 4) jaws 69a, 69b are opened by catch projection 80; the 'rejected' component then falls into the above-mentioned pocket.

The apparatus described is universal, that is to say it is capable of inserting leads 10 in holes 100a regardless of the pitch p between the lead; this is made possible firstly by carriages 4, 5 which enable the same distance to be obtained between the centres of bushes 23, 24 as the above-mentioned pitch, and secondly by prongs 54 of centering device 150 which enable the needles to be 'centred' to correspond with a number of pitches p.

When the leads have been duly inserted, the apparatus enables them to be clamped to printed circuit 100; this is achieved by means of the above-mentioned bushes which, as already mentioned, bend the protruding sections of lead 10c against circuit 100.

Moreover this apparatus is so constructed that it will not insert the leads in holes 100a if the latter are not co-axial with respect to the bushes, or if the needles do not link up with the leads; furthermore the apparatus will not clamp the leads to the printed circuit if they are only partially inserted in it or if they are not inserted absolutely correctly; the functions just mentioned are carried out by the moving elements 43, 44 (and associated needles) and sensors 52 as a result of the mutual sliding movements between moving elements and relevant sensors.

The apparatus described above is designed and constructed so as not to interfere with components 11 already fitted to the printed circuit; in fact jaws 69a, 69b are released from the body of the component in such a way that they hug the body itself, under light pressure, without this altering the positioning and/or balance of printed circuit 100 as a result of the counterbalancing action of pressure device 81 on the above-mentioned body.

In conclusion the apparatus is capable, by means of needles 47, 48, of noting the unfolding of the elementary cycle of the insertion of the leads in holes 100a and of stopping this cycle for any of the above listed reasons. It should be pointed out that providing niches 47a, 48a in the heads of the needles has a beneficial effect when it comes to connecting them up with the ends of the leads 10a, and it proves particularly advantageous in cases where the above-mentioned ends 10a have a pyramid-shaped profile as shown in the attached illustrations.

The mechanisms for operating the apparatus are either operated by cams or by mechanisms with 'all' or 'nothing' type control (e.g: jacks): this simplifies interfacing the apparatus with a microprocessor.

I claim:

1. An apparatus for inserting the leads of an electrical or electronic component having parallel leads into holes in a substrate comprising:

means for horizontally supporting the substrate at an operation location;

first and second carriages;

means for horizontally displacing said carriages towards and away from each other below the substrate, each of said carriages including:

a bushing means for displacing said bushing upwardly into engagement with the substrate;

a needle, said bushing including means for supporting said needle for vertical sliding movement relative thereto;

means for displacing said needle relative to said bushing from a lowered position below the top surface of said bushing to an elevated position a distance selected so that said needle will extend above the substrate when the bushing is engaging the substrate;

said bushing including an opening at the top thereof selectively configured so that the displacement of said carriage in a selected direction will result in the lead received by said opening and having a predetermined length will be bent up against the substrate.

2. An apparatus according to claim 1, further comprising means for detecting the location of said needles relative to said bushings.

3. An apparatus according to claim 2, further comprising means for biasing said bushing toward said engaging position.

4. An apparatus according to claim 3, further comprising means for maintaining a single orientation for said bushing as it is displaced towards said engaging position.

* * * * *